(12) United States Patent
Lee et al.

(10) Patent No.: US 12,408,519 B2
(45) Date of Patent: Sep. 2, 2025

(54) DISPLAY APPARATUS AND METHOD OF MANUFACTURING THE SAME

(71) Applicant: Samsung Display Co., Ltd., Yongin-si (KR)

(72) Inventors: Junhee Lee, Hwaseong-si (KR); Kiseong Seo, Seoul (KR); Deok Hoi Kim, Seongnam-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 443 days.

(21) Appl. No.: 17/565,925

(22) Filed: Dec. 30, 2021

(65) Prior Publication Data

US 2022/0123085 A1  Apr. 21, 2022

Related U.S. Application Data

(62) Division of application No. 16/592,138, filed on Oct. 3, 2019, now Pat. No. 11,239,300.

(30) Foreign Application Priority Data

Nov. 28, 2018  (KR) .......................... 10-2018-0149132

(51) Int. Cl.
*H10K 59/126* (2023.01)
*H10K 59/12* (2023.01)
(Continued)

(52) U.S. Cl.
CPC ......... *H10K 59/126* (2023.02); *H10K 59/131* (2023.02); *H10K 77/111* (2023.02); *H10K 59/1201* (2023.02)

(58) Field of Classification Search
CPC .. H10K 59/131; H10K 59/126; H10K 59/124; H10K 59/1201
See application file for complete search history.

(56) References Cited

U.S. PATENT DOCUMENTS 7,727,823 B2  6/2010  Jeong et al.
9,356,087 B1 *  5/2016  Lee .......................... H10K 71/00
(Continued)

FOREIGN PATENT DOCUMENTS

| CN | 103794628 | 5/2014 |
| CN | 106887447 | 6/2017 |

(Continued)

OTHER PUBLICATIONS

Extended European Search Report corresponding to European Application or Patent No. 19211800.8 dated May 6, 2020.

(Continued)

*Primary Examiner* — Vongsavanh Sengdara
(74) *Attorney, Agent, or Firm* — Harness, Dickey & Pierce, P.L.C.

(57) ABSTRACT

A display apparatus includes a base substrate including a display area and a peripheral area, a conductive layer formed on the base substrate in an entirety of the peripheral area and the display area, a buffer layer on the conductive layer, a thin film transistor on the buffer layer in the display area, an electrode in a contact hole that is formed through the buffer layer to expose a side surface of the conductive layer in the peripheral area, the electrode making contact the conductive layer, an insulating pattern in the contact hole on the electrode, and a wiring on the insulating pattern and electrically connected to the electrode.

12 Claims, 17 Drawing Sheets

(51) Int. Cl.
  *H10K 59/131* (2023.01)
  *H10K 77/10* (2023.01)

(56) References Cited

U.S. PATENT DOCUMENTS

| | | | |
|---|---|---|---|
| 10,192,896 B2 | 1/2019 | Kim et al. | |
| 2012/0146886 A1* | 6/2012 | Minami | G09G 3/3283 |
| | | | 345/80 |
| 2014/0117342 A1* | 5/2014 | Kwon | H10K 59/12 |
| | | | 257/40 |
| 2014/0167050 A1* | 6/2014 | Jin | H10D 86/0221 |
| | | | 438/34 |
| 2014/0217397 A1* | 8/2014 | Kwak | H10K 77/111 |
| | | | 257/43 |
| 2015/0379923 A1 | 12/2015 | Lee et al. | |
| 2016/0179229 A1* | 6/2016 | Ahn | H10K 59/873 |
| | | | 345/173 |
| 2016/0181345 A1* | 6/2016 | Lee | H05K 1/028 |
| | | | 257/40 |
| 2017/0170206 A1* | 6/2017 | Lee | H10D 86/441 |
| 2017/0263887 A1* | 9/2017 | Han | H10K 50/844 |
| 2017/0287938 A1* | 10/2017 | Lee | H10K 59/131 |
| 2018/0048055 A1 | 2/2018 | O'Driscoll et al. | |
| 2018/0315809 A1 | 11/2018 | Kim et al. | |

FOREIGN PATENT DOCUMENTS

| | | |
|---|---|---|
| CN | 107180595 | 9/2017 |
| EP | 3 182 473 | 6/2017 |
| EP | 3 392 921 | 10/2018 |
| JP | 2014-107242 | 6/2014 |
| KR | 10-2006-0109655 | 10/2006 |
| KR | 10-2011-0085904 | 7/2011 |
| KR | 10-2016-0001584 | 1/2016 |
| KR | 10-2016-0049173 | 5/2016 |
| KR | 10-2016-0084549 | 7/2016 |
| KR | 10-2017-0121392 | 11/2017 |
| KR | 10-2017-0135550 | 12/2017 |
| KR | 10-2018-0024909 | 3/2018 |

OTHER PUBLICATIONS

Chinese Office Action, with English Translation, for Chinese Patent Application No. 201911177383.9, dated Feb. 3, 2024.
Korean Notice of Allowance with English translation for Korean Patent Application No. 10-2018-0149132, dated Sep. 30, 2024.
Korean Office Action, with English Translation, for Korean Application No. 10-2018-0149132, dated Oct. 23, 2023.

* cited by examiner

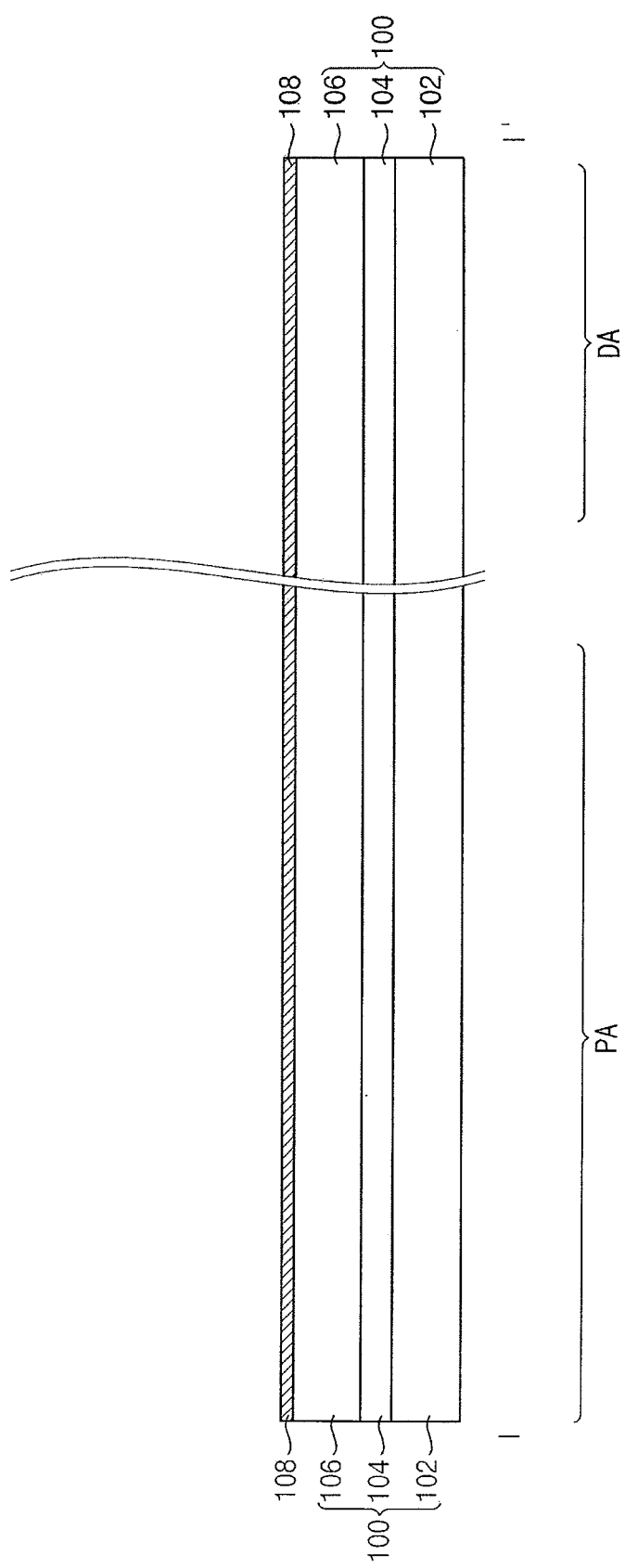

DISPLAY APPARATUS AND METHOD OF MANUFACTURING THE SAME

CROSS-REFERENCE TO RELATED APPLICATION(S)

This is a divisional application of U.S. patent application Ser. No. 16/592,138, filed Oct. 3, 2019 (now U.S. Pat. No. 11,239,300), the disclosure of which is incorporated herein by reference in its entirety. U.S. patent application Ser. No. 16/592,138 claims priority to and benefit of Korean Patent Application No. 10-2018-0149132 under 35 U.S.C. § 119, filed on Nov. 28, 2018 in the Korean Intellectual Property Office, the entire contents of which are incorporated herein by reference.

BACKGROUND

1. Field

Embodiments relate to a display apparatus and a method of manufacturing the display apparatus.

2. Description of the Related Art

Recently, a display apparatus having light weight and small size has been manufactured. A cathode ray tube (CRT) display apparatus has been used due to a performance and a competitive price. The CRT display apparatus may be limited as to size or portability. Therefore, a display apparatus such as a plasma display apparatus, a liquid crystal display apparatus, and an organic light emitting display apparatus has been highly regarded due to small size, light weight, and low-power-consumption.

SUMMARY

Embodiments are directed to a display apparatus, including a base substrate including a display area and a peripheral area, a conductive layer formed on the base substrate in an entirety of the peripheral area and the display area, a buffer layer on the conductive layer, a thin film transistor on the buffer layer in the display area, an electrode in a contact hole that is formed through the buffer layer to expose a side surface of the conductive layer in the peripheral area, the electrode making contact the conductive layer, an insulating pattern in the contact hole on the electrode, and a wiring on the insulating pattern and electrically connected to the electrode.

The electrode may be coupled to a ground voltage or a constant voltage.

The peripheral area may include a pad area in which a pad portion electrically connected to a driving unit is disposed, and a folding area between the pad portion and the display area, and the contact hole may be in the folding area.

The buffer layer may not be present in the folding area.

The insulating pattern may cover a portion where the buffer layer is not present in the folding area.

The conductive layer may be an n+ doped amorphous silicon layer.

The base substrate may include a first polyimide layer, a barrier film layer on the first polyimide layer, and a second polyimide layer on the barrier film layer.

The base substrate may further include a second conductive layer disposed between the barrier film layer and the second polyimide layer or between the barrier film layer and the first polyimide layer, and the second conductive layer may be exposed by the contact hole, and the second conductive layer may contact the electrode.

The base substrate may include a first polyimide layer, a barrier film layer on the first polyimide layer, and a second polyimide layer on the barrier film layer, and the conductive layer may be disposed between the barrier film layer and the second polyimide layer or between the barrier film layer and the first polyimide layer.

The contact hole may be formed through the conductive layer so as expose a side surface of the conductive layer, and the side surface of the conductive layer may contact the electrode.

The contact hole may be formed by removing a portion of the base substrate.

The thin film transistor may include an active pattern, a gate electrode, a source electrode and a drain electrode, and the display apparatus may further include a gate insulating layer disposed between the active pattern and the gate electrode, and an interlayer insulating layer between the gate electrode and the source and drain electrodes.

The display apparatus may further include a via insulating layer on the source and drain electrode, a first electrode on the via insulating layer and electrically connected to the drain electrode, a light emitting layer on the first electrode, and a second electrode on the light emitting layer.

The via insulating layer may cover the wiring.

The electrode may extend to an upper surface of the interlayer insulating layer, and the wiring may contact the electrode on the interlayer insulating layer.

Embodiments are also directed to a method of manufacturing a display apparatus, the method including forming a conductive layer on a base substrate, forming a buffer layer on the conductive layer, forming an active pattern on the buffer layer, forming an insulating layer on the active pattern, forming a contact hole by partially removing the insulating layer and the buffer layer to expose the conductive layer, forming an electrode that contacts the conductive layer in the contact hole, forming an insulating pattern on the electrode so as to expose a portion of the electrode, and forming a wiring electrically connected to the electrode on the insulating pattern.

The conductive layer may be an n+ doped amorphous silicon layer.

The method may further include forming a gate electrode on the insulating layer before forming the contact hole, and forming an interlayer insulating layer on the gate electrode. In forming the contact hole, the contact hole may be formed by partially removing the interlayer insulating layer, the insulating layer, and the buffer layer.

In forming the contact hole, a portion of the conductive layer may be removed to form the contact hole, and a side surface of the conductive layer may be exposed, and the side surface of the conductive layer may contact the electrode.

The base substrate may include at least one polyimide layer and at least one barrier film layer.

BRIEF DESCRIPTION OF THE DRAWINGS

Features will become apparent to those of skill in the art by describing in detail example embodiments with reference to the attached drawings in which:

FIGS. 9A to 9I illustrate cross-sectional views of the display apparatuses of FIGS. 1 to 3;

DETAILED DESCRIPTION

Figure 1:
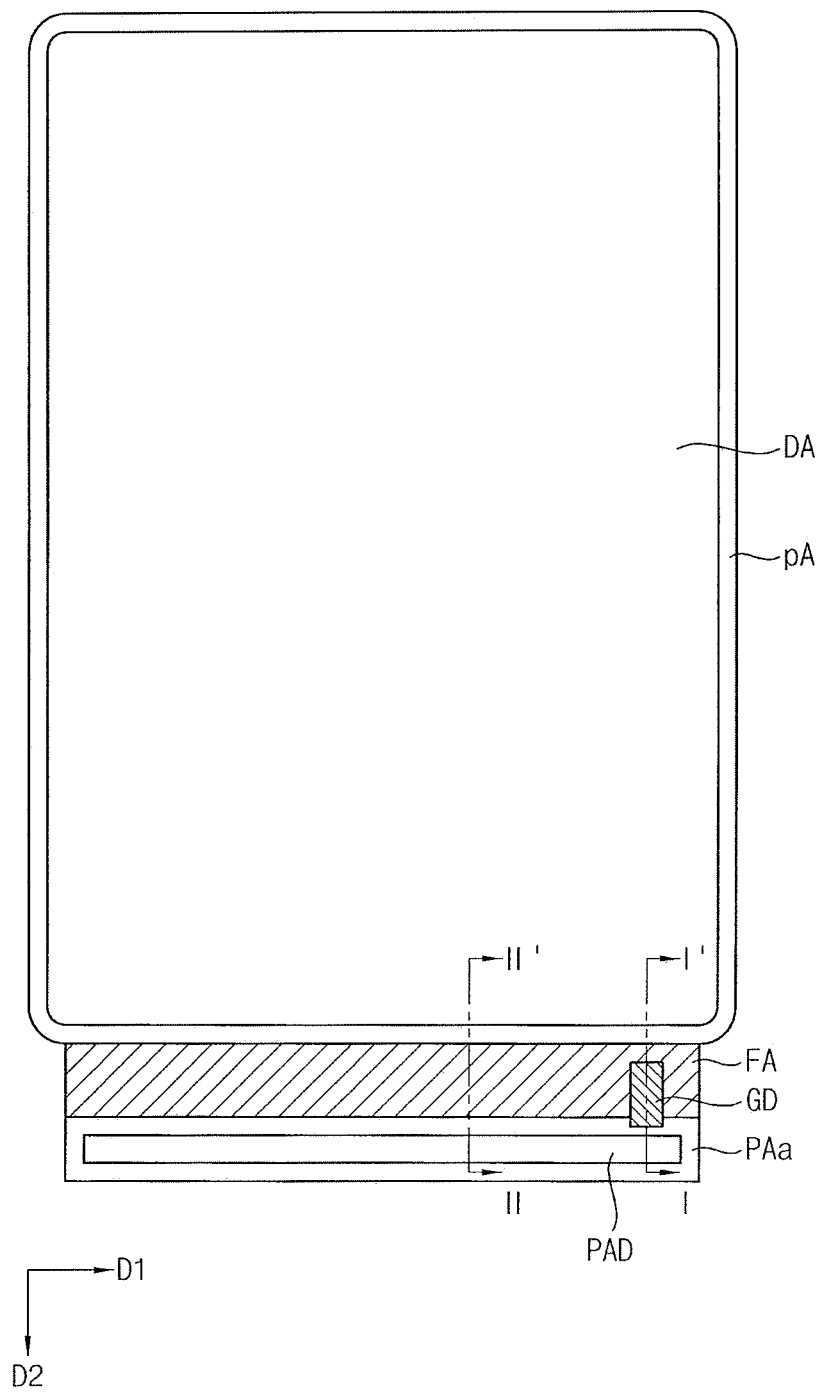
FIG. 1 illustrates a plan view illustrating a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIG. 1 is a plan view illustrating a display apparatus according to an example embodiment.

Referring to FIG. 1, the display apparatus may include a display area DA in which an image is displayed, a peripheral area PA surrounding the display area DA, a pad area PAa, and a folding area FA.

The display area may be on a plane formed by a first direction D1 and a second direction D2 perpendicular to the first direction D1. The display apparatus may include a plurality of pixels in the display area DA. The display apparatus may further include a driving unit in the peripheral area PA for driving the pixels, a power supply unit for supplying power to the pixels, and a wiring unit for connecting the pixels and the driving unit.

Each of the pixels may be provided as a minimum unit for displaying an image. The pixels may include a display element for emitting color light. For example, the display element may be a liquid crystal display device (LCD), an electrophoretic display device (EPD device), an electrowetting display device (EWD device), or an organic light emitting display device (OLED device). For convenience of explanation, the organic light emitting display apparatus will be described as an example of the display element.

Each pixel may emit one of red, green, and blue colors, for example. Each of the pixels may emit colors such as cyan, magenta, yellow, and white, for example. These pixels will be described below in detail with reference to FIGS. 2 and 3.

The peripheral area PA may include the pad area PAa in which the pad portion PAD (to which the driving unit is connected) is disposed and the folding area FA disposed between the pad part PAD and the display area DA where the display apparatus is foldable. The folding area FA and the pad area PAa may extend in the first direction D1, respectively.

An electrode GD may be in the folding area FA. The electrode GD may apply a constant voltage such as a ground voltage to a conductive layer on a base substrate. Thus, it may be possible to prevent a change in characteristics of the thin film transistor in the pixel due to an external factor (shield effect). A detailed description thereof will be described below with reference to FIGS. 2 and 3.

Figure 2:
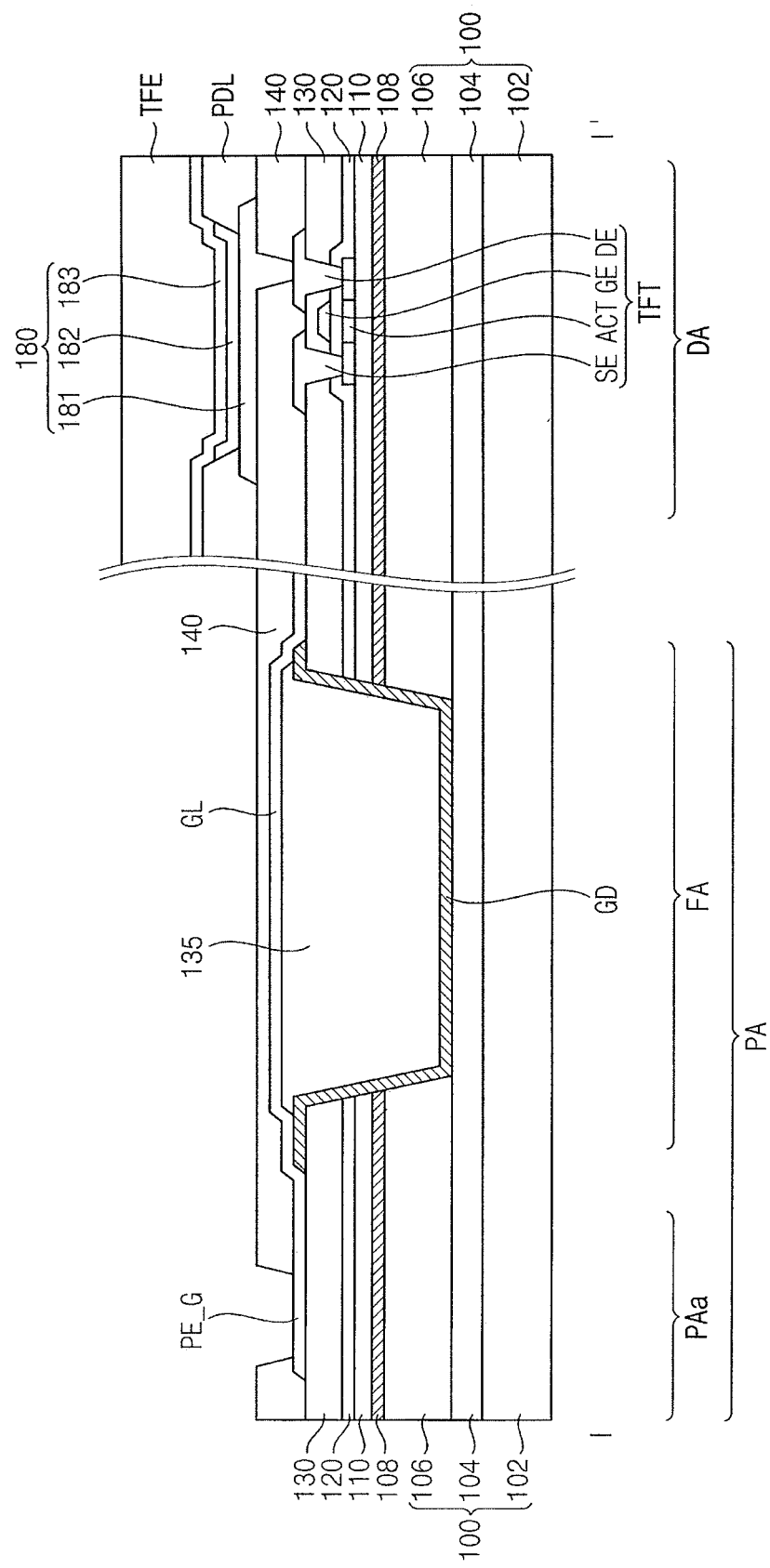
FIG. 2 illustrates a cross-sectional view taken along a line I-I' of FIG. 1.
Figure 3:
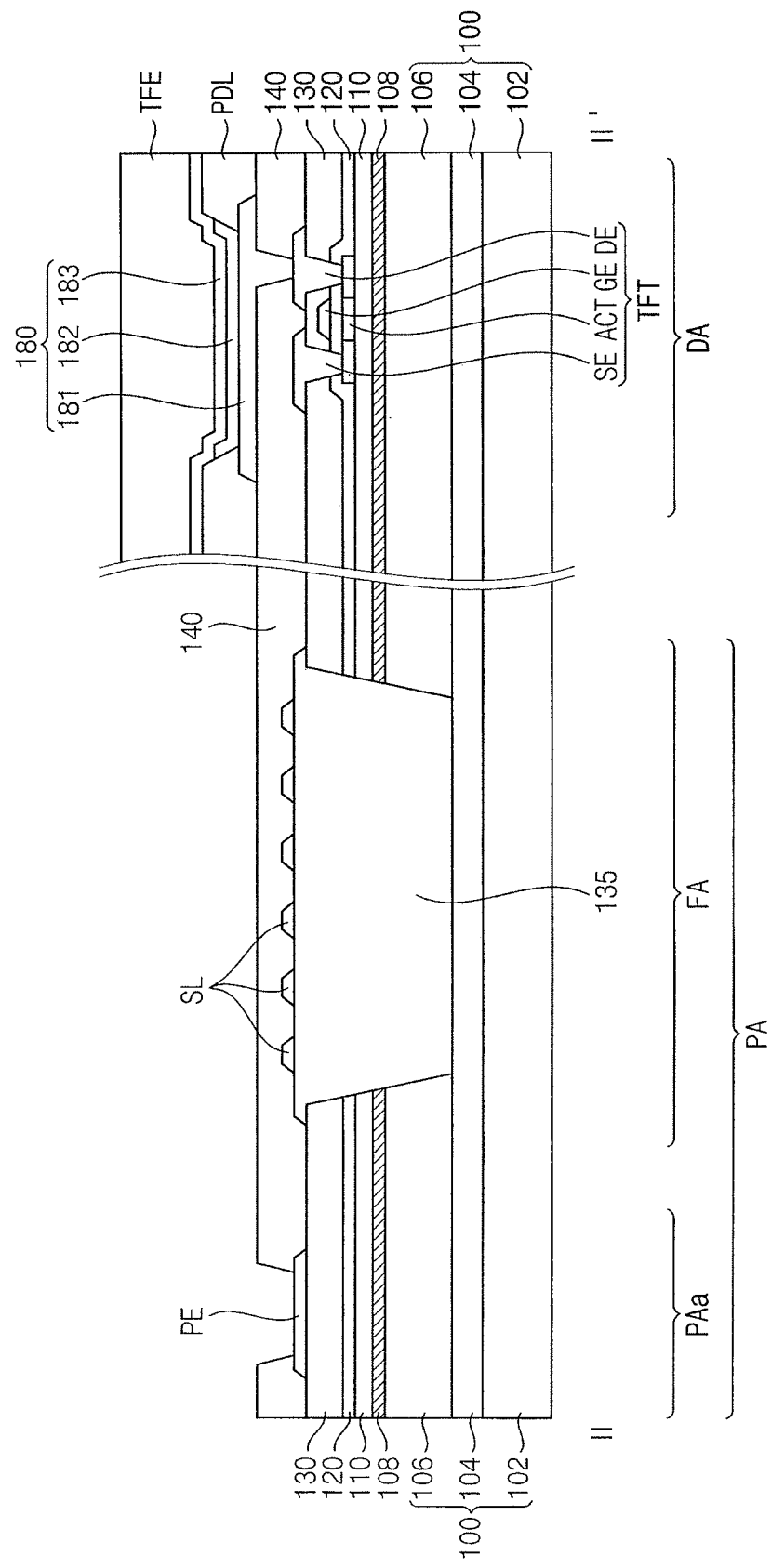
FIG. 3 illustrates a cross-sectional view taken along a line II-II' of FIG. 1.

FIG. 2 is a cross-sectional view taken along a line I-I' of FIG. 1. FIG. 3 is a cross-sectional view taken along a line II-II' of FIG. 1.

Referring to FIGS. 2 and 3, the display apparatus may include a base substrate 100, a conductive layer 108, a buffer layer 110, an active pattern ACT, a gate insulating layer 120, a gate pattern, an interlayer insulating layer 130, an electrode GD, an insulating pattern 135, a data pattern, a via insulating layer 140, a pixel defining layer PDL, and a thin-film encapsulation layer TFE.

The base substrate 100 may include transparent or opaque insulation materials. For example, the base substrate 100 may include a quartz substrate, a synthetic quartz substrate, a calcium fluoride substrate, a fluoride-doped quartz substrate, a sodalime glass substrate, a non-alkali glass substrate etc. In another implementation, the base substrate 100 may include a flexible transparent material such as a flexible transparent resin substrate, e.g., a polyimide substrate. The polyimide substrate may include a first polyimide layer 102, a barrier film layer 104, a second polyimide layer 106, etc. For example, the polyimide substrate may have a configuration where the first polyimide layer 102, the barrier film layer 104, and the second polyimide layer 106, are stacked on a rigid glass substrate.

The conductive layer 108 may be on the base substrate 100. The conductive layer 108 may be formed corresponding to an entirety of the display area DA and the peripheral area PA, and may be configured to apply a ground voltage or a constant voltage. For example, the conductive layer 108 may be an n+ doped amorphous silicon (a-Si) layer.

The buffer layer 110 may be on the conductive layer 108. The buffer layer 110 may be on the entire base substrate 100. The buffer layer 110 may prevent the diffusion of metal atoms and/or impurities from the substrate 100 and the conductive layer 108 into the active pattern ACT. In addition, the buffer layer 110 may control a rate of heat transfer in a crystallization process for forming the active pattern ACT, which may help provide uniformity to the active pattern ACT.

The active pattern ACT may be in the display area DA on the buffer layer 110. The active pattern ACT may include amorphous silicon or polycrystalline silicon. In another embodiment, the active pattern ACT may include an oxide semiconductor. The active pattern ACT may include a drain region D and a source region S doped with impurities, and a channel region C between the drain region D and the source region S.

The gate insulating layer 120 may be on the buffer layer 110 on which the active pattern ACT is disposed. The gate insulating layer 120 may cover the active pattern ACT on the buffer layer 110 and may be formed at substantially the same thickness along the profile of the active pattern ACT. The gate insulating layer 120 may include an inorganic insulating material such as a silicon compound or a metal oxide.

The gate pattern may be on the gate insulating layer 120. The gate pattern may include a signal line such as a gate line and a gate electrode GE to overlap with the active pattern ACT. The gate pattern may be formed using a metal, an alloy, a metal nitride, a conductive metal oxide, a transparent conductive material, or the like.

The interlayer insulating layer 130 may be on the gate insulating layer 120 on which the gate pattern is disposed. For example, the interlayer insulating layer 130 may sufficiently cover the gate pattern on the gate insulating layer 120, and may have a substantially flat upper surface without forming a step around the gate pattern. In another implementation, the interlayer insulating layer 130 may cover the gate pattern on the gate insulating layer 120 and may be formed at substantially the same thickness along the profile of the gate pattern. The interlayer insulating layer 130 may include a silicon compound, a metal oxide, or the like. The interlayer insulating layer 130 may be formed of a plurality of layers.

In the folding area FA of the peripheral region PA, the interlayer insulating layer 130, the gate insulating layer 120, and the buffer layer 110 may not be formed. Thus, the interlayer insulating layer 130, the gate insulating layer 120, and the buffer layer 110 may not be formed in the folding area FA, or may be removed in the folding area FA. The folding area FA is a folded part in the final product. If the interlayer insulating layer 130, the gate insulating layer 120, and the buffer layer 110 which are inorganic films, is formed in the folding area FA, damage to the interlayer insulating layer 130, the gate insulating layer 120, and the buffer layer 110, such as cracks, may occur when the display apparatus is folded in the folding portion FA.

In removing the inorganic films, a portion of the base substrate may be removed. For example, a portion of the second polyimide layer 106 in the folding area FA may be removed. Thus, a contact hole may be formed to expose the conductive layer 108 through the interlayer insulating layer 130, the gate insulating layer 120, and the buffer layer 110.

The electrode GD may be disposed within the contact hole in the folding area FA. Thus, the electrode GD may be in the contact hole, which exposes a side surface of the conductive layer 108, to be contacted with the side surface of the conductive layer 108 (side contact). Thus, the contact hole may be formed through the conductive layer 108 such that the side of the conductive layer 108 is exposed by the contact hole, and the side of the conductive layer 108 may be in contact the electrode GD. The electrode GD may be formed to extend to an upper surface of the interlayer insulating layer 130 and may be in contact with a wiring GL (to be described below) at a portion that is exposed by the insulating pattern 135 on the interlayer insulating layer 130. The electrode GD may be formed using a metal, an alloy, a metal nitride, a conductive metal oxide, a transparent conductive material, or the like.

In an implementation, the contact hole may be formed only up to the buffer layer 110, so that the conductive layer 108 is not removed, and the electrode GD may contact the upper surface of the conductive layer 108.

A ground voltage or a constant voltage may be applied to the electrode GD. The conductive layer 108 electrically connected to the electrode GD may overlap with the thin film transistor TFT including the active pattern ACT and the gate electrode GE. Thus, the thin film transistor TFT may be prevented from being affected by external influences, such as static electricity, flowing from the base substrate 100 (shielding effect). The conductive layer 108 electrically connected to the electrode GD may overlap with the thin film transistor TFT including the active pattern ACT and the gate electrode GE, and may be disposed between the thin film transistor TFT and the base substrate 100. Thus, it may be possible to prevent a change in the characteristics of the thin film transistor TFT from external influences (such as static electricity) flowing from the base substrate 100 (shielding effect).

The insulating pattern 135 may be in the contact hole. Thus, the insulating pattern 135 may be formed corresponding to the portion in which the interlayer insulating layer 130, the gate insulating layer 120, and the buffer layer 110 are removed. The insulating pattern 135 may be formed to reduce a step with the interlayer insulating layer 130 in the folding area FA. In the drawing, for understanding, a step is shown as being formed with the interlayer insulating layer 130, although the step may be minimized in practice. The insulating pattern 135 may include an organic insulating material and may not be easily damaged even when the folding area FA is folded.

The data pattern may be on the interlayer insulating layer 130 on which the insulating pattern 135 is disposed. The data pattern may include a source electrode SE and a drain electrode DE of the thin film transistor TFT, and a signal line SL such as the wiring GL, and a data line. The data pattern may be formed using a metal, an alloy, a metal nitride, a conductive metal oxide, a transparent conductive material, or the like. For example, the data pattern may be formed of a metal such as copper, aluminum or the like having high conductivity. The data pattern may have a plurality of layered structures. For example, the data pattern may include a titanium layer, an aluminum layer on the titanium layer, and titanium on the aluminum layer.

The wiring GL may extend in the second direction (refer to D2 in FIG. 1) in the peripheral region PA, and may intersect the insulating pattern 135. The wiring GL may be configured to apply a ground voltage. For example, the wiring GL may extend to the pad area PAa and may be connected to a ground terminal PE_G of the pad portion (refer to PAD in FIG. 1) to receive the ground voltage from the driving unit. In addition, the wiring GL may extend to the display area DA to supply the ground voltage to the pixel structure.

The via insulating layer 140 may be on the thin film transistor TFT. The via insulating layer 140 may be on the thin film transistor TFT. The via insulating layer 140 may cover the wiring GL. The via insulating layer 140 may be formed in a single layer structure, but may be formed in a multi-layer structure including at least two insulating layers. The via insulating layer 140 may be formed using an organic material such as a photoresist, an acrylic resin, a polyimide resin, a polyamide resin, or a siloxane-based resin.

The light emitting structure 180 may include a first electrode 181, a light emitting layer 182, and a second electrode 183.

The first electrode 181 may be on the via insulating layer 140. The first electrode 181 may include a reflective material or a transmissive material in accordance with the emission type of the display apparatus. In an example embodiment, the first electrode 181 may have a single layer structure or a multi-layer structure, which may include a metal film, an alloy film, a metal nitride film, a conductive metal oxide film, and/or a transparent conductive film.

The pixel defining layer PDL may be on the via insulating layer 140 on which the first electrode 181 is disposed. The pixel defining layer PDL may be formed using an organic material. For example, the pixel defining layer PDL may include a photoresist, an acryl-based resin, a polyimide-based resin, a polyamide-based resin, a siloxane-based resin, etc. In an example embodiment, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be on the first electrode 181 exposed through the opening of the pixel defining layer PDL. In addition, the light emitting layer 182 may extend on a sidewall of the opening of the pixel defining layer PDL. In an example embodiment, the light emitting layer 182 may include an organic light emitting layer (EL), a hole injection layer (HIL), a hole transfer layer (HTL), an electron transfer layer (ETL), an electron injection layer (EIL), etc. In an example embodiment, the hole injection layer, the hole transport layer, the electron transport layer, and the electron injection layer may be formed in common to correspond to a plurality of pixels. In an example embodiment, a plurality of organic light emitting layers may be formed using light emitting materials for generating different colors of light such as a red color of light, a green color of light and a blue color of light in accordance with color pixels of the display device. In an example embodiment, the organic light emitting layer of the of the light emitting layer 182 may include a plurality of stacked light emitting materials for generating a red color of light, a green color of light and a blue color of light to thereby emitting a white color of light. Elements of the light emitting layer 182 may be commonly formed so as to correspond to a plurality of pixels, and each pixel may be divided by a color filter layer.

The second electrode 183 may be on the pixel defining layer PDL and the light emitting layer 182. The second electrode 183 may include a transmissive material or a reflective material in accordance with the emission type of the display device. In an example embodiment, the second electrode 183 may have a single layer structure or a multi-layer structure, which may include a metal film, an alloy film, a metal nitride film, a conductive metal oxide film, and/or a transparent conductive film.

The thin film encapsulation layer TFE may be on the second electrode 183. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween. In an example embodiment, a sealing substrate may be provided for shielding outside air and moisture from penetrating into the display apparatus, instead of providing the thin film encapsulation layer TFE.

According to an example embodiment, in order to form a folding area, an inorganic film may be removed, an electrode may be formed before an insulating pattern is formed, and an electrode may be configured to apply a ground voltage or a constant voltage to a conductive layer disposed between the thin film transistor and the base substrate. In such a structure, the display quality may be improved.

Figure 4:
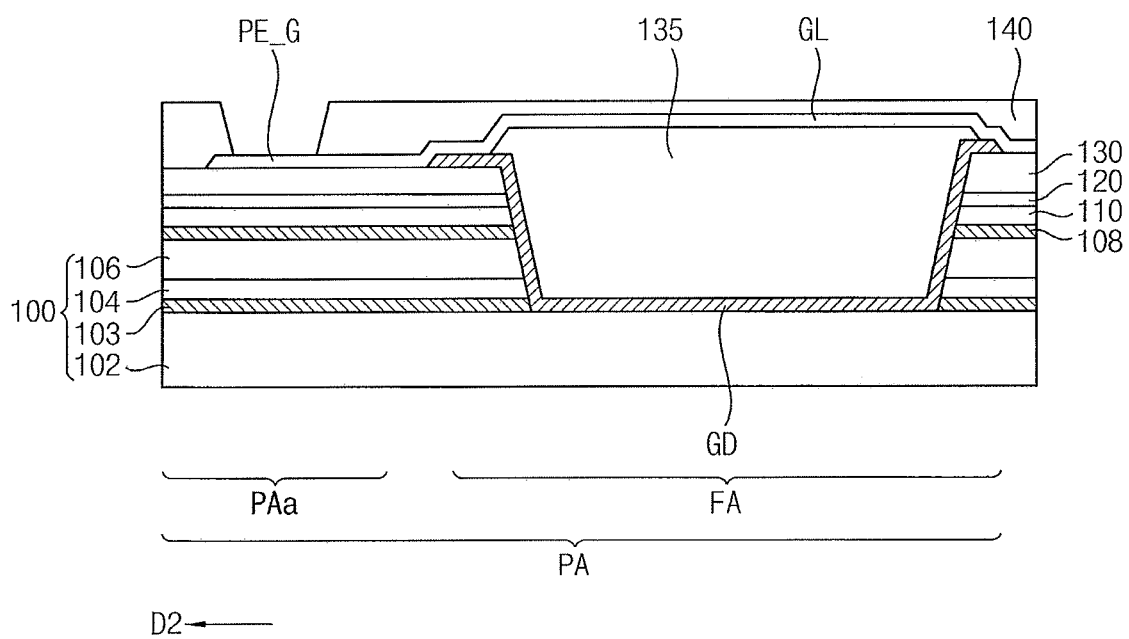
FIG. 4 illustrates a cross-sectional view of a display apparatus according to an example embodiment.

FIG. 4 is a cross-sectional view illustrating a display apparatus according to an example embodiment.

Referring to FIG. 4, the display apparatus is substantially the same as the display apparatus of FIGS. 1 to 3 except that it further includes a second conductive layer 103, and the second conductive layer 103 is electrically connected to an electrode GD. Therefore, a repeated explanation may be omitted.

The display apparatus may include a base substrate 100, a conductive layer 108, a buffer layer 110, an active pattern (ACT), a gate insulating layer 120, a gate pattern including a gate electrode GE, an interlayer insulating layer 130, an electrode GD, an insulating pattern 135, a data pattern including a wiring GL, a via insulating layer 140, a pixel defining layer PDL, and a thin-film encapsulation layer TFE.

The base substrate 100 may include a first polyimide layer 102, a second conductive layer 103 on the first polyimide layer 102, a barrier film layer 104 on the second conductive layer 103, and a second polyimide layer 106 on the barrier film layer 104. The second conductive layer 103 may be an n+ doped amorphous silicon (a-Si) layer like the conductive layer 108.

In a folding area FA, a contact hole may be formed through the interlayer insulating layer 130, the gate insulating layer 120, the buffer layer 110, the conductive layer 108, the second polyimide layer 106, the barrier film layer 104, and the second conductive layer 103 to expose side surfaces of the conductive layer 108 and the second conductive layer 103.

The electrode GD may be in the contact hole. Thus, the electrode GD may be in the contact hole that exposes the side surface of the conductive layer 108 and the side surface of the second conductive layer 103, so that the side surface of the conductive layer 108 and the side surface of the second conductive layer 103 may contact the electrode GD.

In an implementation, the contact hole may be formed only up to the barrier film layer 104, the second conductive layer 103 may not be removed, and an upper surface of the second conductive layer 103 may contact the electrode GD.

Figure 5:
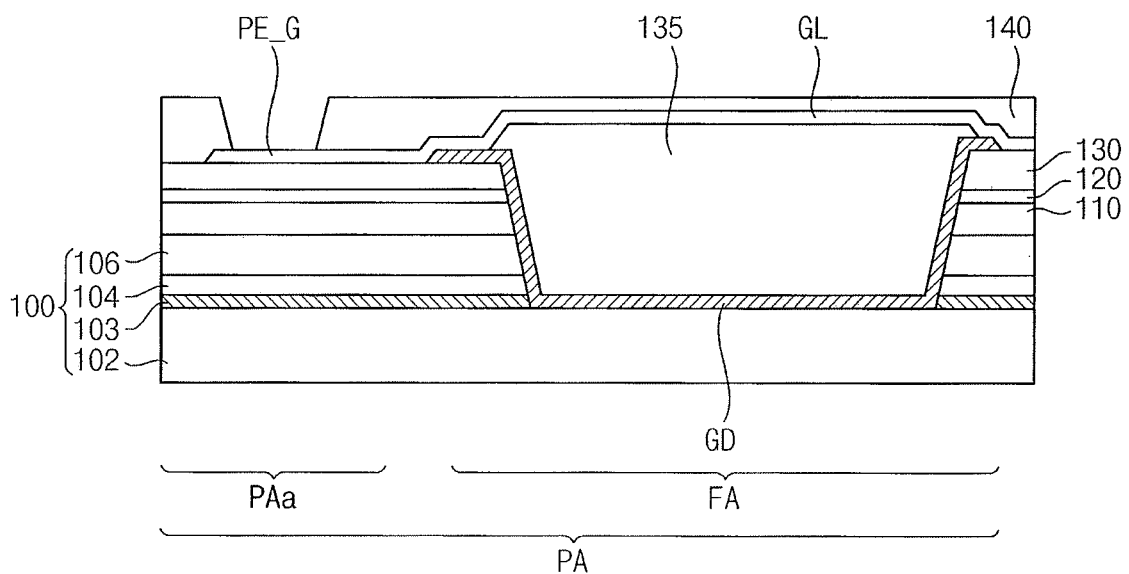
FIG. 5 illustrates a cross-sectional view of a display apparatus according to an example embodiment.

FIG. 5 is a cross-sectional view illustrating a display apparatus according to an example embodiment.

Referring to FIG. 5, the display apparatus is substantially the same as the display apparatus of FIGS. 1 to 3 except that the display apparatus includes a second conductive layer 103 instead of a conductive layer 108, and the second conductive layer 103 is electrically connected to an electrode GD. Therefore, repeated explanation may be omitted.

The display apparatus may include a base substrate 100, a buffer layer 110, an active pattern ACT, a gate insulating layer 120, a gate pattern including a gate electrode GE, an interlayer insulating layer 130, an electrode GD, an insulating pattern 135, a data pattern including a wiring GL, a via insulating layer 140, a pixel defining layer PDL, and a thin-film encapsulating layer TFE.

The base substrate 100 may include a first polyimide layer 102, a second conductive layer 103 on the first polyimide layer 102, a barrier film layer 104 on the second conductive layer 103, and a second polyimide layer 106 on the barrier film layer 104.

In the folding area FA, a contact hole may be formed through the interlayer insulating layer 130, the gate insulating layer 120, the buffer layer 110, the second polyimide layer 106, the barrier film layer 104, and the second conductive layer 103 to expose the second conductive layer 103.

The electrode GD may be disposed within the contact hole. Thus, the electrode GD may be in the contact hole that exposes a side surface of the second conductive layer 103, and may contact the side surface of the second conductive layer 103.

In an implementation, the contact holes may be formed only up to the barrier film layer 104, so that the second conductive layer 103 may not be removed, and an upper surface of the second conductive layer 103 may contact the electrode GD.

Figure 6:
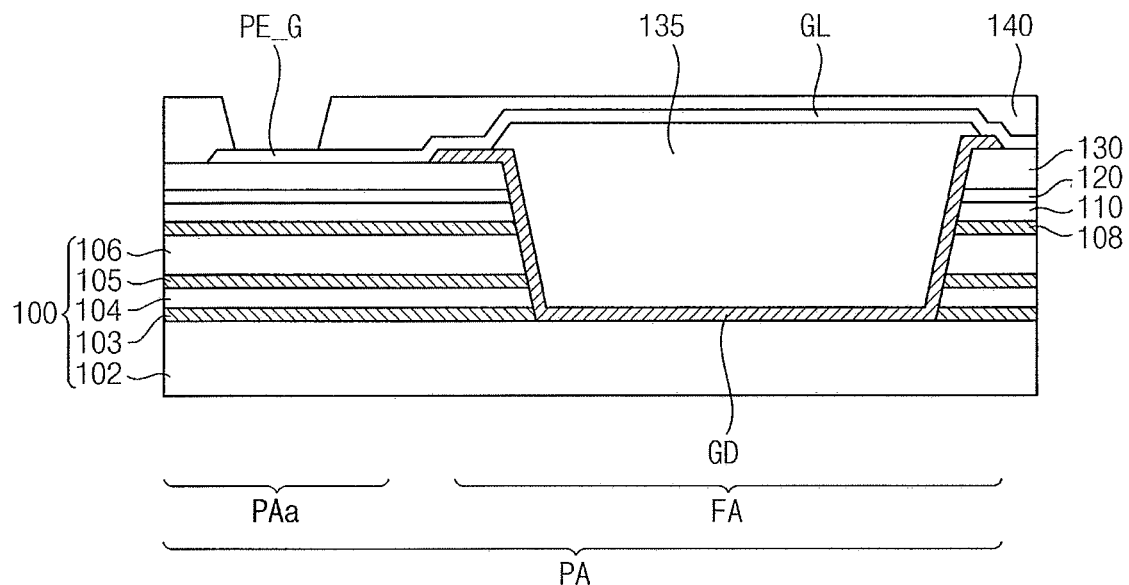
FIG. 6 illustrates a cross-sectional view of a display apparatus according to an example embodiment.

FIG. 6 is a cross-sectional view illustrating a display apparatus according to an example embodiment.

Referring to FIG. 6, the display apparatus is substantially the same as the display apparatus of FIG. 5 except that the display apparatus further includes a third conductive layer 105. Therefore, repeated explanation may be omitted.

The display apparatus may include a base substrate 100, a conductive layer 108, a buffer layer 110, an active pattern ACT, a gate insulating layer 120, a gate pattern including a gate electrode GE, an interlayer insulating layer 130, an electrode GD, an insulating pattern 135, a data pattern including a wiring GL, a via insulating layer 140, a pixel defining layer PDL, and a thin-film encapsulating layer TFE.

The base substrate 100 may include a first polyimide layer 102, a second conductive layer 103 on the first polyimide layer 102, a barrier film layer 104 on the second conductive layer 103, a third conductive layer 105 on the barrier film layer 104, and a second polyimide layer 106 on the third conductive layer 105. The third conductive layer 105 may be an n+ doped amorphous silicon (a-Si) layer like the conductive layer 108.

In the folding area FA, a contact hole may be formed through the interlayer insulating layer 130, the gate insulating layer 120, the buffer layer 110, the conductive layer 108, the second polyimide layer 106, the third conductive layer 105, the barrier film layer 104, and the second conductive layer 103 to expose the second conductive layer 103.

The electrode GD may be disposed within the contact hole. Thus, the electrode GD may be in the contact hole exposing a side surface of the conductive layer 108, a side surface of the third conductive layer 105, a side surface of the second conductive layer 103 and may contact the side surface of the second conductive layer 103.

In an implementation, the contact hole may be formed only up to the barrier film layer 104, and the second conductive layer 103 may not be removed, and an upper surface of the second conductive layer 103 may make contact the electrode GD.

Figure 7:
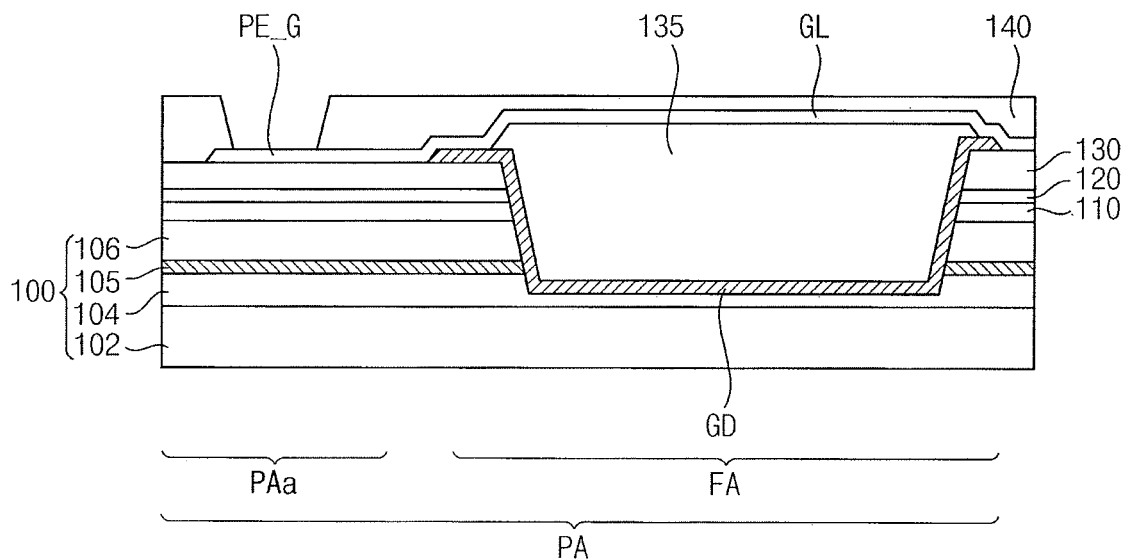
FIG. 7 illustrates a cross-sectional view of a display apparatus according to an example embodiment.

FIG. 7 is a cross-sectional view illustrating a display apparatus according to an example embodiment.

Referring to FIG. 7, the display apparatus is substantially the same as the display apparatus of FIGS. 1 to 3, except that a third conductive layer 105 is formed instead of a conductive layer 108, and a contact hole is formed to a portion of the barrier film layer 104. Therefore, repeated explanation may be omitted.

The display apparatus may include a base substrate 100, a buffer layer 110, an active pattern ACT, a gate insulating layer 120, a gate pattern including a gate electrode GE, an interlayer insulating layer 130, an electrode GD, an insulating pattern 135, a data pattern including a wiring GL, a via insulating layer 140, a pixel defining layer PDL, and a thin-film encapsulating layer TFE.

The base substrate 100 may include a first polyimide layer 102, a barrier film layer 104 on the first polyimide layer 102, and a third conductive layer 105 on the barrier film layer 104, and a second polyimide layer 106 on the third conductive layer 105.

In the folding area FA, a contact hole may be formed through the interlayer insulating layer 130, the gate insulating layer 120, the buffer layer 110, the second polyimide layer 106, the third conductive layer 105, and a portion of the barrier film layer 104 to expose a side surface of the third conductive layer 105.

The electrode GD may be disposed within the contact hole. Thus, the electrode GD may be in the contact hole that exposes the side surface of the third conductive layer 105, and may contact the side surface of the third conductive layer 105.

Figure 8:
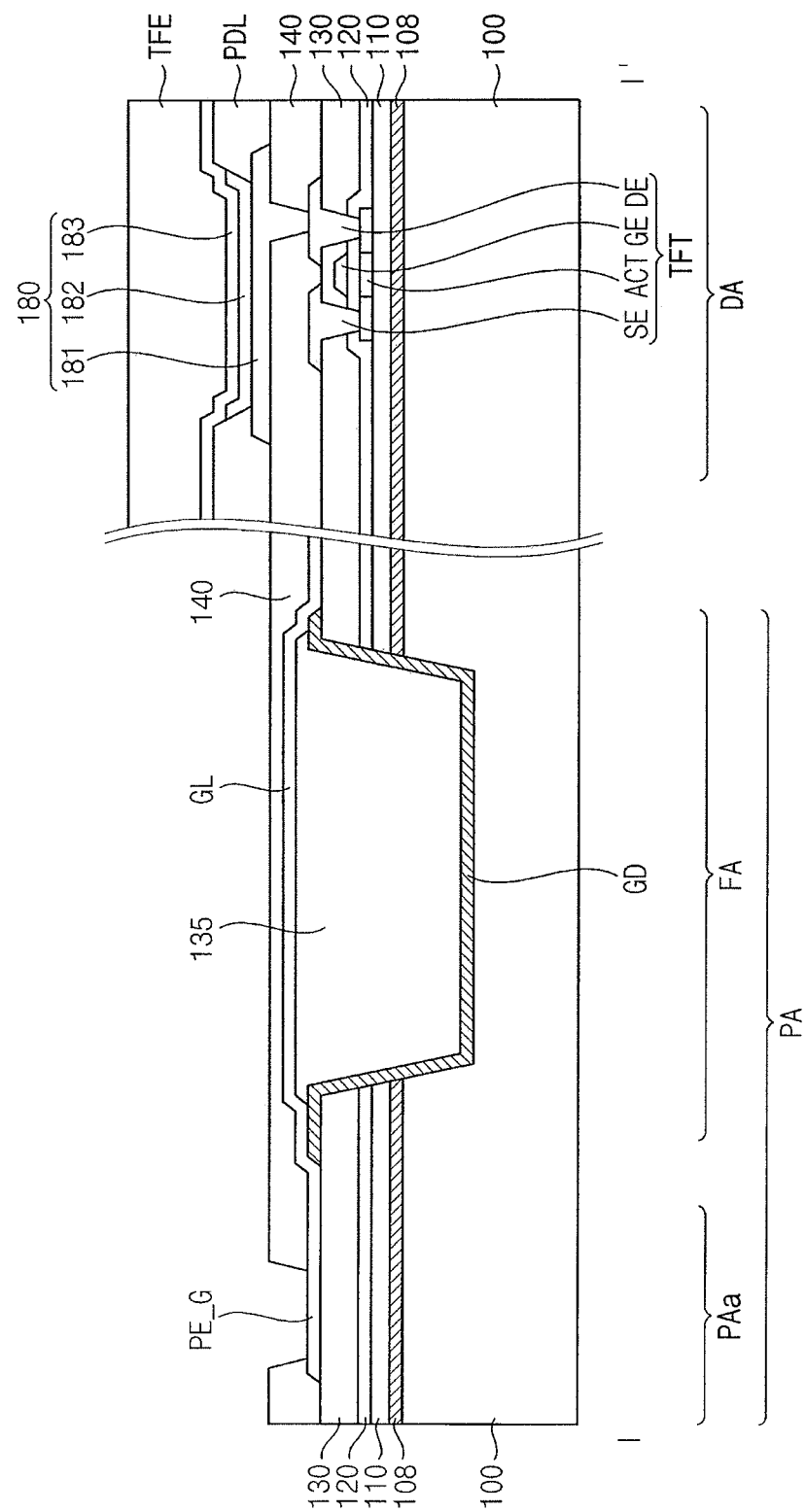
FIG. 8 illustrates a cross-sectional view of a display apparatus according to an example embodiment.

FIG. 8 is a cross-sectional view illustrating a display apparatus according to an example embodiment.

Referring to FIG. 8, the display apparatus is substantially the same as the display apparatus of FIGS. 1 to 3, except for a base substrate 100. Therefore, repeated explanation may be omitted.

The display apparatus may include a base substrate 100, a conductive layer 108, a buffer layer 110, an active pattern ACT, a gate insulating layer 120, a gate pattern including a gate electrode GE, an interlayer insulating layer 130, an electrode GD, an insulating pattern 135, a data pattern including a drain electrode DE and a wiring GL, a via insulating layer 140, a pixel defining layer PDL, and a thin-film encapsulating layer TFE.

The base substrate 100 may be made of a transparent or opaque material. For example, the base substrate 100 may be a quartz substrate, a synthetic quartz substrate, a calcium fluoride substrate, a fluorine-doped quartz substrate, a sodalime glass substrate, an alkali-free non-alkali glass substrates, and the like.

In a peripheral area PA, a contact hole may be formed through the interlayer insulating layer 130, the gate insulating layer 120, the buffer layer 110, the conductive layer 108, and a portion of the base substrate 100 to expose a side surface of the conductive layer 108.

The electrode GD may be in the contact hole. Thus, the electrode GD may be in the contact hole that exposes the side surface of the conductive layer 108, and may contact the side surface of the conductive layer 108.

FIGS. 9A to 9I are cross-sectional views illustrating stages in a method of forming the display apparatus of FIGS. 1 to 3.

Referring to FIG. 9A, a conductive layer 108 may be formed on a base substrate 100. The base substrate 100 may include a first polyimide layer 102, a barrier film layer 104, and a second polyimide layer 106. The conductive layer 108 may be formed by forming an amorphous silicon (a-Si) layer on the base substrate 100 and then doping with an impurity. For example, the conductive layer 108 may be an n+ doped amorphous silicon layer.

Figure 9B:
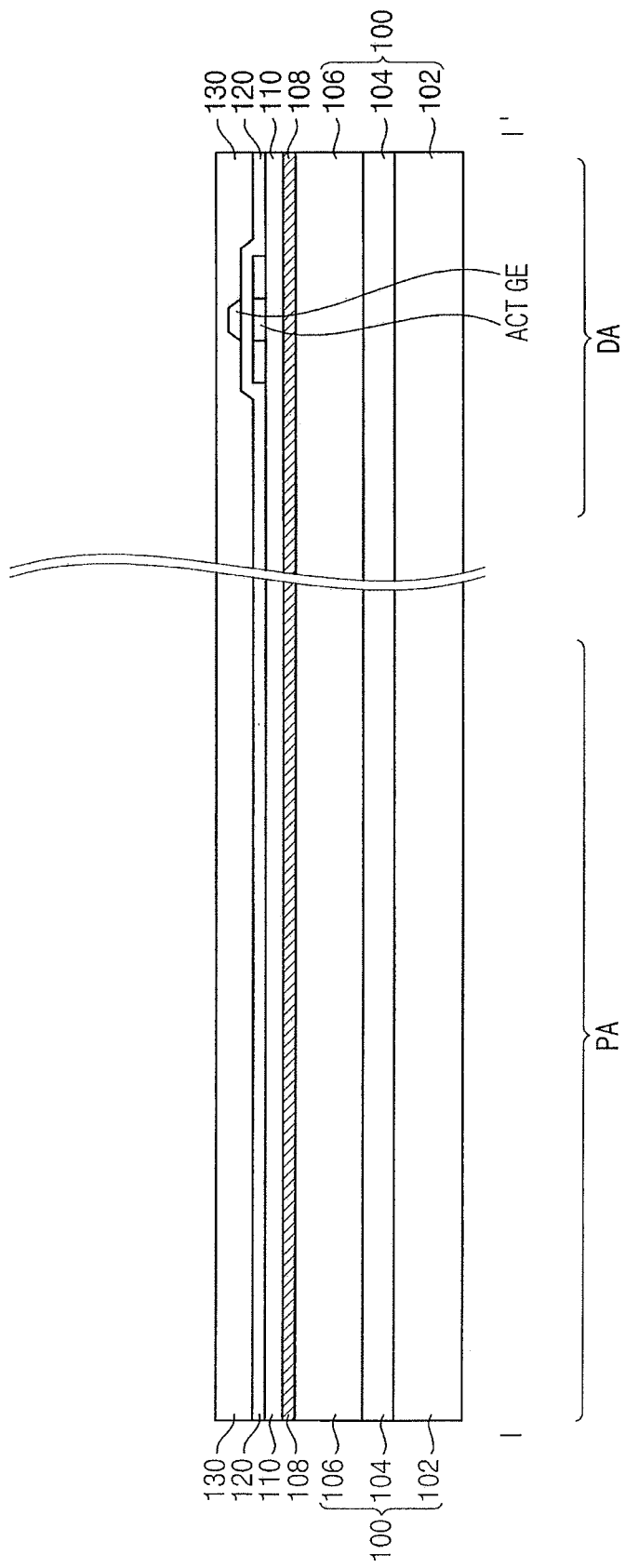

Referring to FIG. 9B, a buffer layer 110, an active pattern ACT, a gate insulating layer 120, a gate pattern including a gate electrode GE, and an interlayer insulating layer 130 may be sequentially formed on the conductive layer 108.

For example, the buffer layer 110, the gate insulating layer 120, and the interlayer insulating layer may be formed by a chemical vapor deposition process, a spin coating process, a plasma enhanced chemical vapor deposition process, a sputtering process, a vacuum deposition process, a high-density plasma-chemical vapor deposition process, a printing process, or the like.

For example, an amorphous silicon layer may be formed on the buffer layer 110, and then the amorphous silicon layer may be crystallized to form a polysilicon layer. Then, the active pattern ACT may be formed by patterning the polysilicon layer by a photolithography method or the like.

For example, the gate pattern may be formed by forming a conductive film on the gate insulating layer 120, and patterning the conductive film using a photolithography process or an etching process using an additional etching mask. The conductive layer may be formed using a printing process, a sputtering process, a chemical vapor deposition process, a pulsed laser deposition (PLD) process, a vacuum deposition process, an atomic layer deposition (ALD) process, and the like.

Figure 9C:
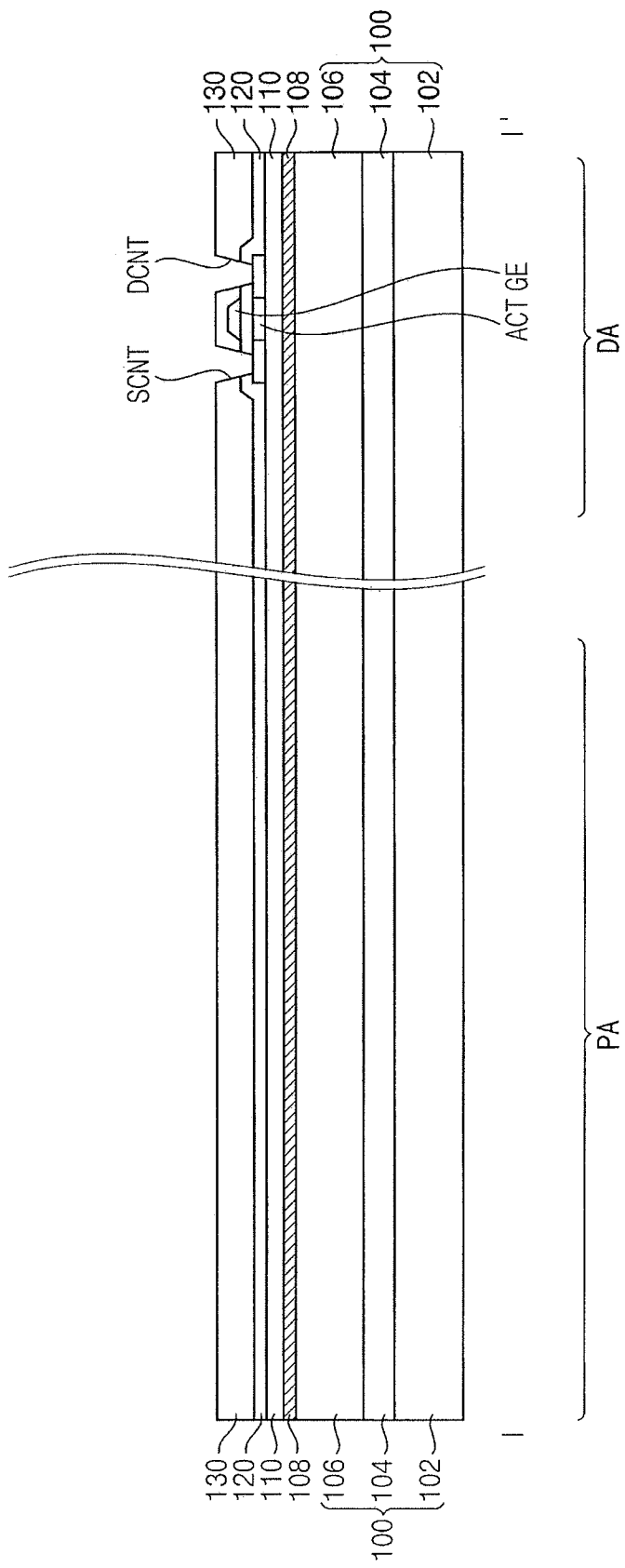

Referring to FIG. 9C, a source contact hole SCNT and a drain contact hole DCNT may be formed to expose the active pattern ACT through the interlayer insulating layer 130 and the gate insulating layer 120.

The source contact hole SCNT and the drain contact hole DCNT may be formed by forming a photoresist layer on the interlayer insulating layer 130, and then exposing and developing the photoresist layer to form a photoresist pattern, and then partially etching the interlayer insulating layer 130 and the gate insulating layer 120 using the photoresist pattern as an etching barrier.

Figure 9D:
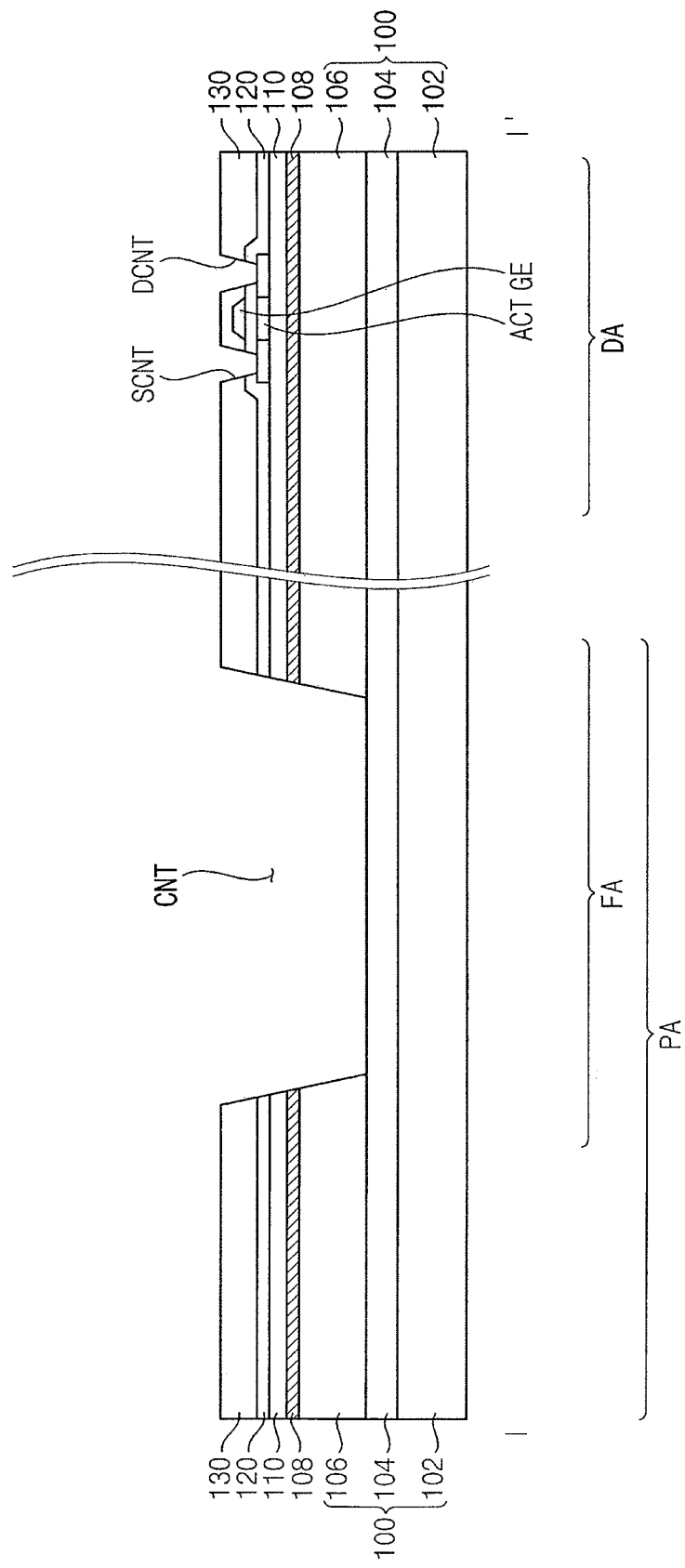

Referring to FIG. 9D, a contact hole CNT exposing a side surface of the conductive layer 108 may be formed. For example, portions corresponding to the interlayer insulating layer 130, the gate insulating layer 120, and the buffer layer 110 in the folding are FA which are inorganic insulation layers may be removed. At this time, a contact hole may be formed through the interlayer insulating layer 130, the gate insulating layer 120, the buffer layer 110, the conductive layer 108, and the second polyimide layer, where an electrode (refer to GD of FIG. 9E) will be formed, to expose the side surface of the conductive layer 108.

The contact hole CNT may be formed by forming a photoresist layer on the interlayer insulating layer 130, exposing and developing the photoresist layer to form a photoresist pattern, and then partially etching the interlayer insulating layer 130 and the gate insulating layer 120.

Here, a depth of the contact hole CNT may vary according to the process and the structure of the display apparatus. The depth may be enough to expose the conductive layer 108 (to expose the second or third conductive layer in other embodiments).

The order of forming the contact holes CNT, the source contact holes SCNT, and the drain contact holes DCNT may be changed, or they may be formed simultaneously using a halftone mask or the like.

Figure 9E:
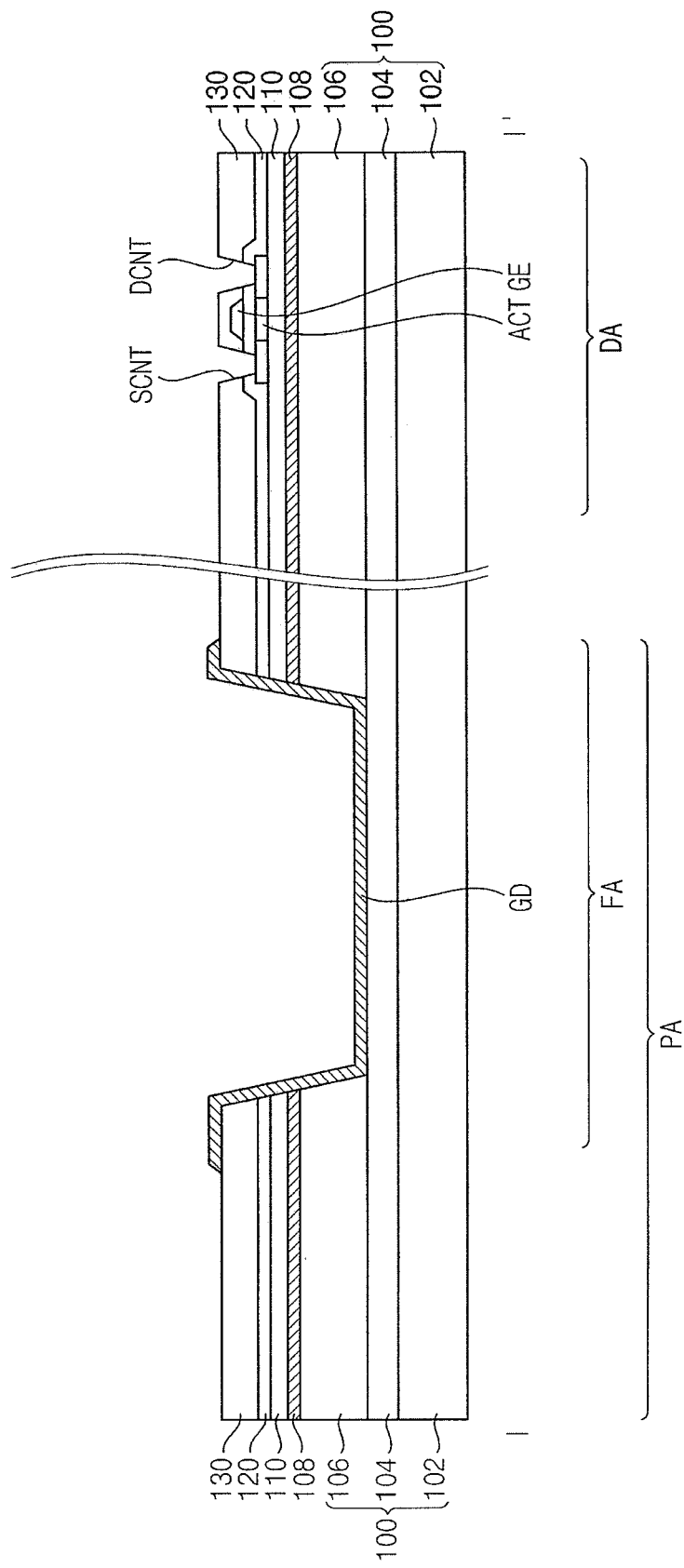

Referring to FIG. 9E, the electrode GD may be formed in the contact hole CNT to contact the side surface of the conductive layer 108. The electrode GD may extend along a side surface of the contact hole CNT and may extend to an upper surface of the interlayer insulating layer 130 for connection with a wiring (refer to GL in FIG. 9G) described below.

Figure 9F:
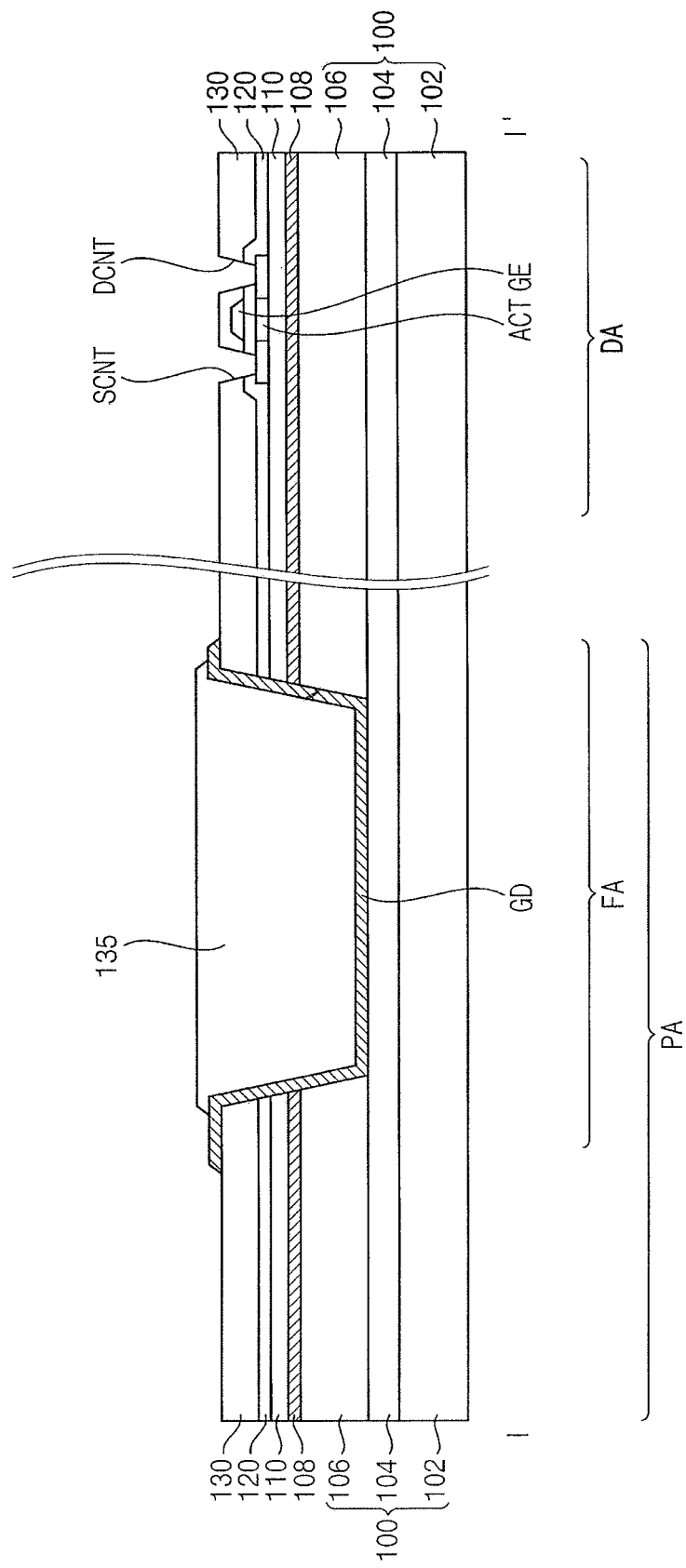

Referring to FIG. 9F, an insulating pattern 135 may be formed in the contact hole CNT on which the electrode GD is formed. The insulating pattern 135 may be formed to correspond to the portion where the interlayer insulating layer 130, the gate insulating layer 120, and the buffer layer 110, which are the inorganic insulation layers, are removed. The insulating pattern 135 may be formed to reduce a step with the interlayer insulating layer 130 in the folding area FA. In the drawing, a step is shown as being formed with the interlayer insulating layer 130, but the step may be minimized.

The insulating pattern 135 may expose a portion of the electrode GD formed up to the upper surface of the interlayer insulating layer 130.

Figure 9G:
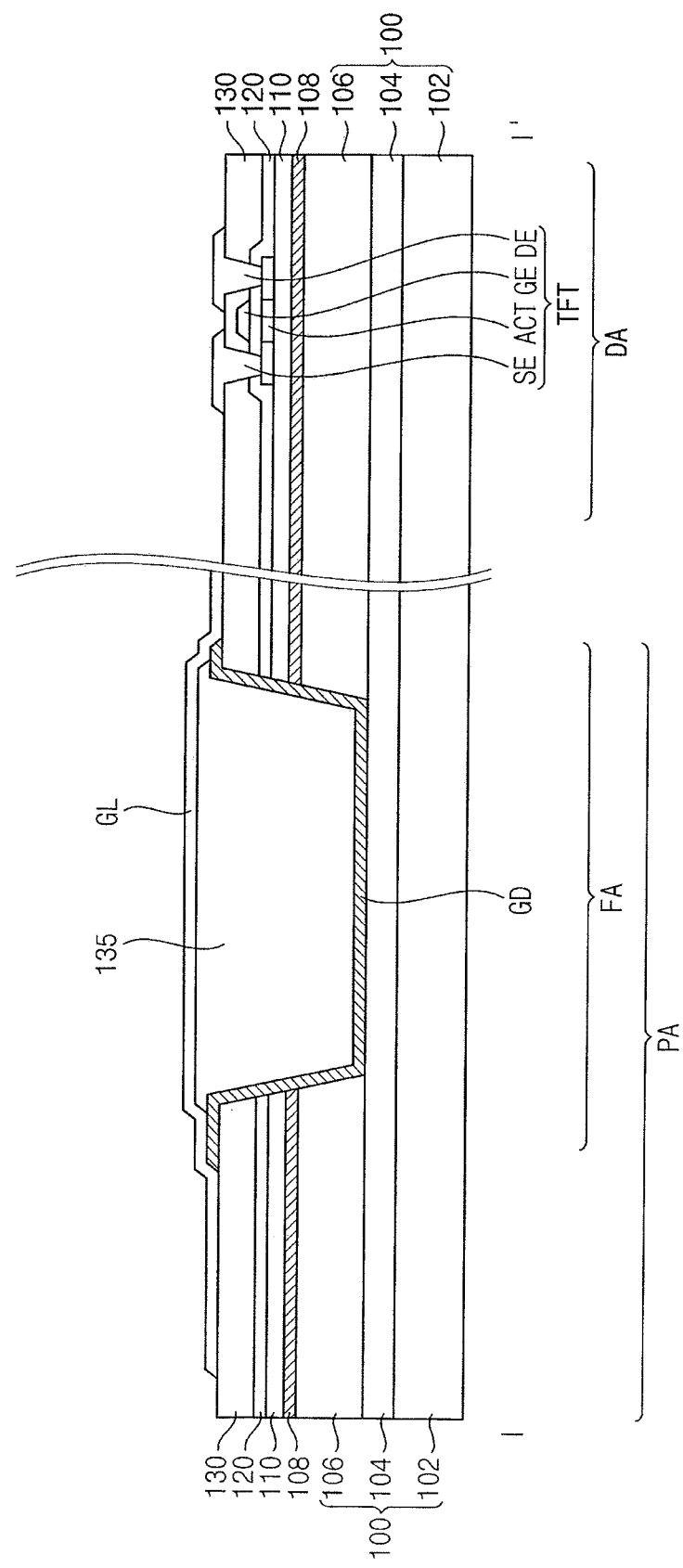

Referring to FIG. 9G, a data pattern including a wiring GL, a source electrode SE, and a drain electrode DE may be formed on the insulating pattern 135 and the interlayer insulating layer 130.

Figure 9H:
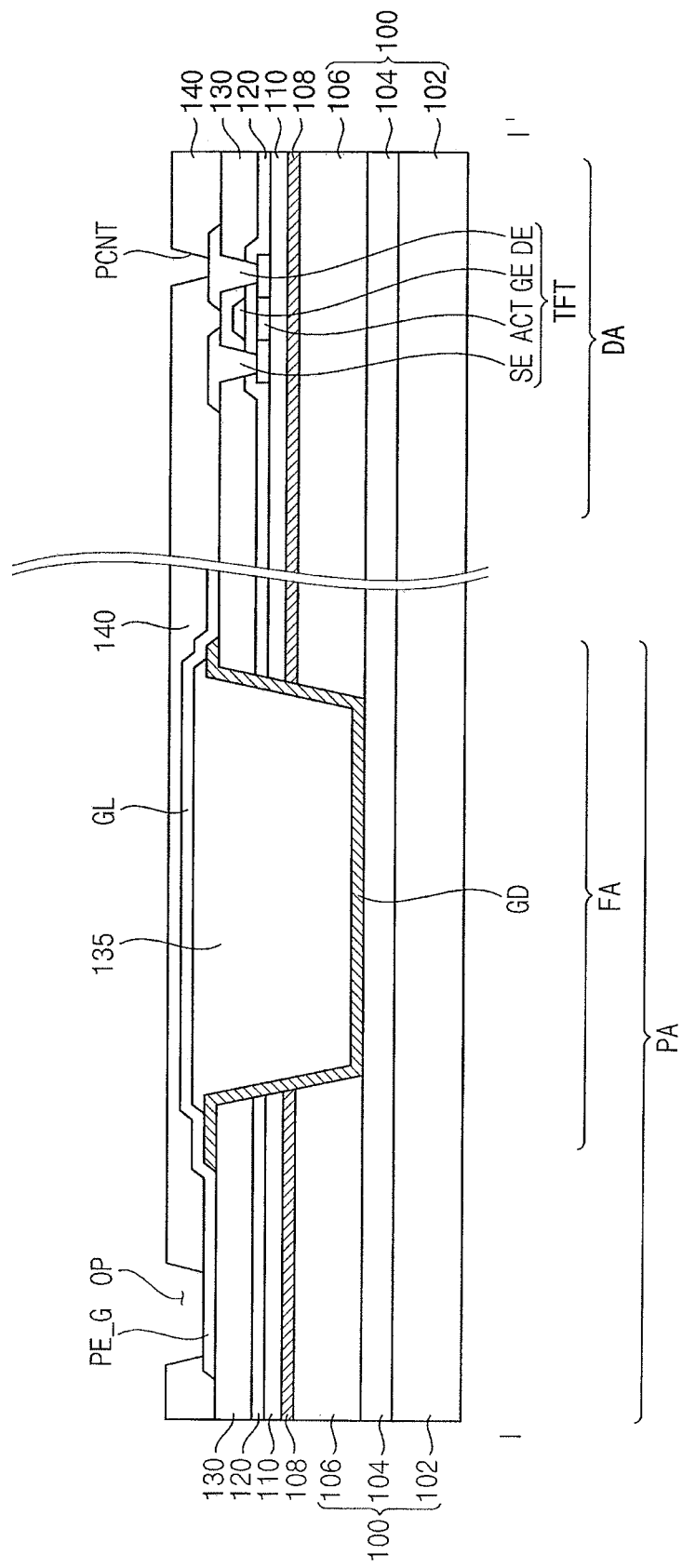

Referring to FIG. 9H, a via insulating layer 140 may be formed on the interlayer insulating layer 130 on which the data pattern is formed. A pixel contact hole PCNT exposing the drain electrode DE and an opening OP exposing a ground terminal PE_G (which is a portion of the wiring GL) may be formed through the via insulating layer 140.

Figure 9I:
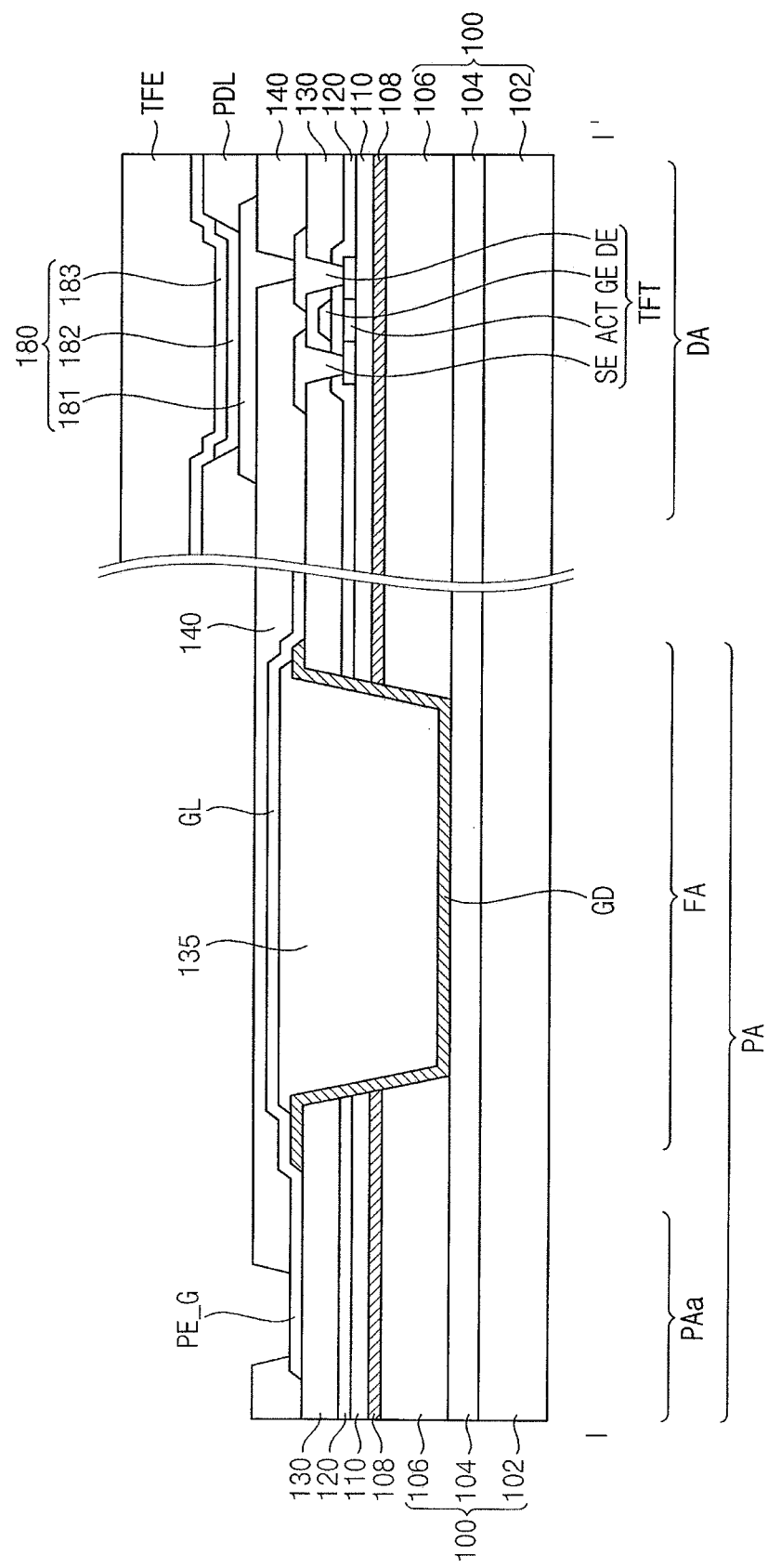

Referring to FIG. 9I, a light emitting layer 182, a second electrode 183, and a thin film encapsulation layer TFE may be formed on the via insulating layer 140 to form the display apparatus. The first electrode 181, the pixel defining layer PDL, the light emitting layer 182, the second electrode 183, and the thin film encapsulation layer TFE may be formed through various suitable methods, and the details are omitted.

According to an example embodiment, when the conductive layer 108 is formed and the inorganic insulation layers in the folding area FA are removed, the contact hole CNT, the electrode GD, the insulating pattern 135, and the wiring GL may be formed. Thus, display quality may be improved by a relatively simple structure and process.

In FIGS. 9A to 9I, the method of manufacturing the display apparatus of FIGS. 1 to 3 has been described. The display apparatus of FIGS. 4 to 8 may be manufactured in a similar manner.

Figure 10:
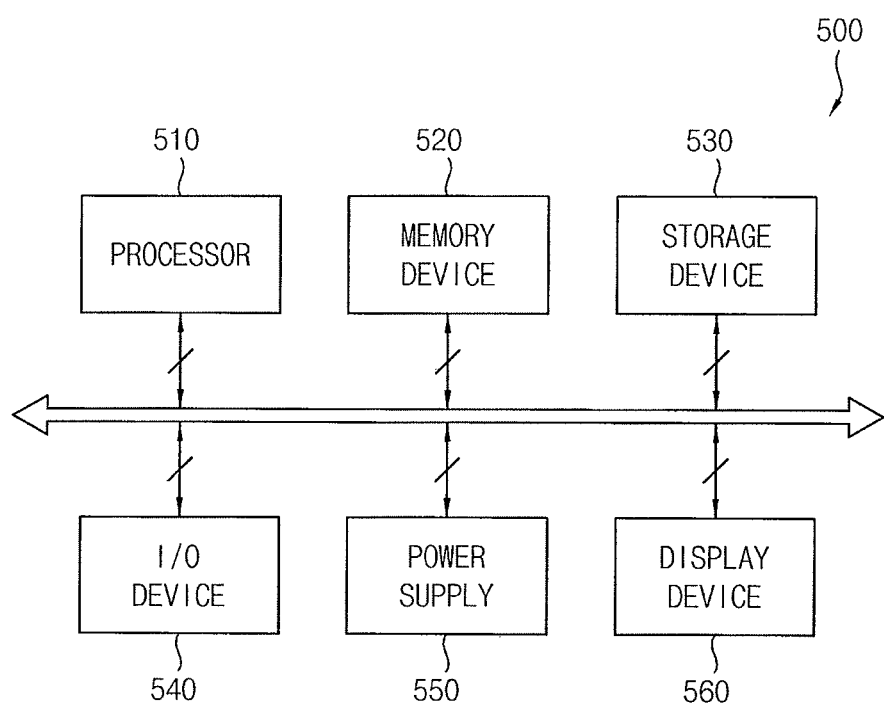
FIG. 10 illustrates a block diagram of an electronic device according to an example embodiment.
Figure 11A:
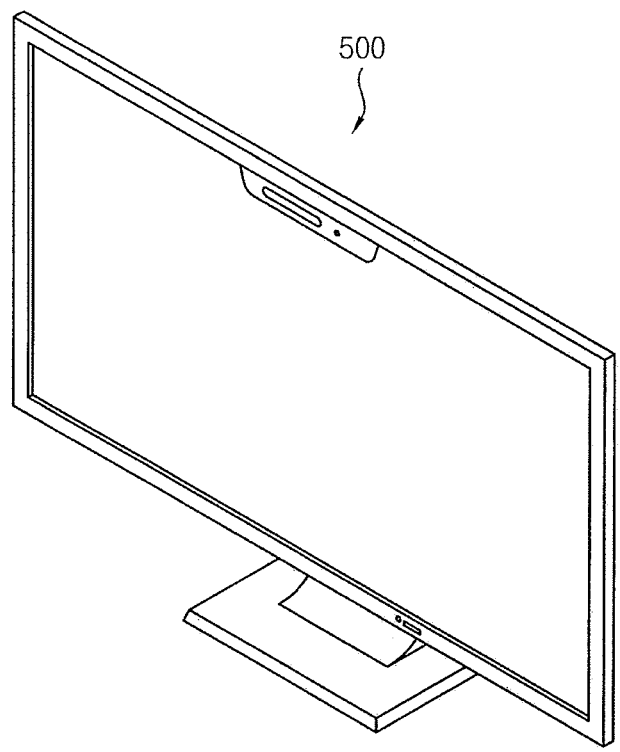
FIG. 11A illustrates a diagram of an example in which the electronic device of FIG. 10 is implemented as a television.
Figure 11B:
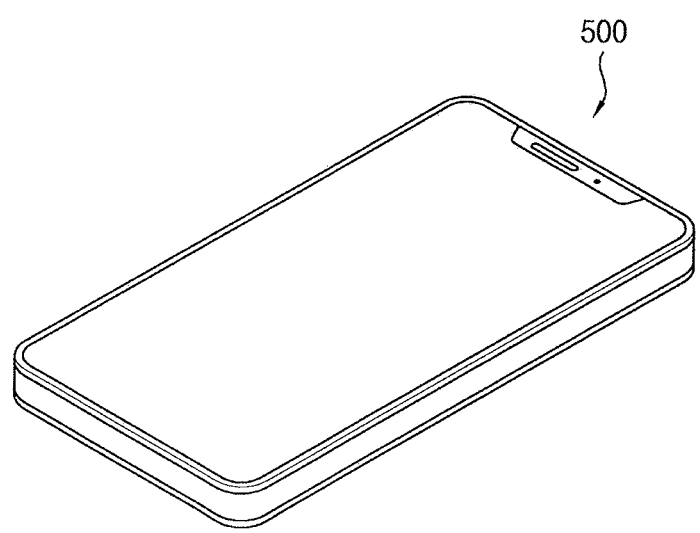
FIG. 11B illustrates a diagram of an example in which the electronic device of FIG. 10 is implemented as a smart phone.

FIG. 10 is a block diagram illustrating an electronic device according to an example embodiment. FIG. 11A is a diagram illustrating an example in which the electronic device of FIG. 10 is implemented as a television. FIG. 11B is a diagram illustrating an example in which the electronic device of FIG. 10 is implemented as a smart phone.

Referring to FIGS. 10 through 11B, the electronic device 500 may include a processor 510, a memory device 520, a storage device 530, an input/output (I/O) device 540, a power supply 550, and a display device 560. The display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an example embodiment, as illustrated in FIG. 11A, the electronic device 500 may be implemented as a television. In another example embodiment, as illustrated in FIG. 11B, the electronic device 500 may be implemented as a smart phone. In other examples, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display device 560 may be coupled to other components via the buses or other communication links. In an example embodiment, the display device 560 may be included in the I/O device 540. According to an example embodiment, the display device 560 may include an electrode in a folding area and to which a ground voltage or a constant voltage is applied, and a conductive layer electrically connected to the electrode and overlapping a thin film transistor, so that display quality may be improved.

Example embodiments may be applied to organic light emitting display devices and various electronic devices including the same. For example, example embodiments may be applied to a mobile phone, a smart phone, a video phone, a smart pad, a smart watch, a tablet PC, a car navigation system, a television, a computer monitor, a notebook, and the like.

By way of summation and review, in a display apparatus that includes a thin film transistor, when characteristics of the thin film transistor (such as the threshold voltage Vth) change depending on external factors, the display quality may be degraded.

As described above, example embodiments relate to a display apparatus that may exhibit improved display quality, and a method of manufacturing the display apparatus.

Example embodiments may provide a display apparatus capable of improving display quality by stabilizing characteristics of the thin film transistor.

According to an example embodiment, in order to form a folding area, an inorganic film is removed, an electrode is formed before an insulating pattern is formed, and the electrode is configured to apply a ground voltage or a constant voltage to a conductive layer disposed between a thin film transistor and a base substrate. Therefore, the display quality may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
    forming a conductive layer on a base substrate;
    forming a buffer layer on the conductive layer;
    forming an active pattern on the buffer layer;
    forming an insulating layer on the active pattern;
    forming a contact hole by partially removing the insulating layer and the buffer layer to expose the conductive layer;
    forming an electrode that contacts the conductive layer in the contact hole;
    forming an insulating pattern on the electrode so as to expose a portion of the electrode with a portion of the insulating pattern disposed in the contact hole; and
    forming a wiring on the insulating pattern, the wiring being electrically connected to the electrode.

2. The method as claimed in claim 1, wherein the conductive layer is an n+ doped amorphous silicon layer.

3. The method as claimed in claim 1, further comprising:
    forming a gate electrode on the insulating layer before forming the contact hole; and
    forming an interlayer insulating layer on the gate electrode,
    wherein in forming the contact hole, the contact hole is formed by partially removing the interlayer insulating layer, the insulating layer, and the buffer layer.

4. The method as claimed in claim 1, wherein in forming the contact hole, a portion of the conductive layer is removed so as to penetrate completely through the conductive layer such that a side surface of the conductive layer is exposed, and
    the side surface of the conductive layer directly contacts the electrode.

5. The method as claimed in claim 4, wherein the electrode directly contacts the side surface of the conductive layer in the contact hole.

6. The method as claimed in claim 1, wherein the base substrate includes at least one polyimide layer and at least one barrier film layer.

7. A method of manufacturing a display apparatus, the method comprising:
    forming a conductive layer on a base substrate;
    forming a buffer layer on the conductive layer;
    forming an active pattern on the buffer layer;
    forming an insulating layer on the active pattern;
    forming a contact hole by partially removing the insulating layer, the buffer layer, and the conductive layer;
    forming an electrode that contacts the conductive layer in the contact hole;
    forming an insulating pattern on the electrode so as to expose a portion of the electrode; and
    forming a wiring on the insulating pattern, the wiring directly connected to the electrode both at one location at a first side of the contact hole and at a second location spaced apart from the first side of the contact hole.

8. The method as claimed in claim 7, wherein
    in forming the contact hole, a portion of the conductive layer is removed so as to penetrate completely through the conductive layer such that a side surface of the conductive layer is exposed, and
    the side surface of the conductive layer directly contacts the electrode in the contact hole.

9. The method as claimed in claim 8, wherein the wiring makes direct contact with both a top surface of the electrode and a side surface of the electrode.

10. The method as claimed in claim 7, wherein the wiring makes direct contact with both a top surface of the electrode and a side surface of the electrode.

11. The method as claimed in claim 7, wherein a portion of the insulating pattern is in the contact hole.

12. The method as claimed in claim 7, wherein
    in forming the contact hole, a portion of the substrate is removed such that a side surface of the conductive layer is exposed, and
    the side surface of the conductive layer directly contacts the electrode in the contact hole.

* * * * *